United States Patent [19]
Tashiro et al.

[11] Patent Number: 5,159,422
[45] Date of Patent: Oct. 27, 1992

[54] PHOTOELECTRIC CONVERSION DEVICE

[75] Inventors: Kazuaki Tashiro, Yokohama; Hideyuki Suzuki, Machida, both of Japan

[73] Assignee: Canon Kabushiki Kaisha, Tokyo, Japan

[21] Appl. No.: 742,729

[22] Filed: Aug. 6, 1991

Related U.S. Application Data

[63] Continuation of Ser. No. 532,130, Jun. 5, 1990, abandoned, which is a continuation of Ser. No. 205,669, Jun. 13, 1988, abandoned.

[30] Foreign Application Priority Data

Jun. 17, 1987 [JP] Japan ................................ 62-152355

[51] Int. Cl.⁵ .................... H01L 27/14; H01L 31/00
[52] U.S. Cl. ........................................ 357/30; 357/4; 250/578.1
[58] Field of Search ............... 357/30, 4; 250/578

[56] References Cited

U.S. PATENT DOCUMENTS 4,565,928  1/1986  Yamamoto et al. .................. 357/31

FOREIGN PATENT DOCUMENTS

| 5697524 | 1/1983 | Japan | 357/30 |
| 61148870 | 7/1986 | Japan | 357/30 |
| 61-176173 | 8/1986 | Japan | 357/30 |
| 61-199660 | 9/1986 | Japan | 357/30 |

Primary Examiner—Jerome Jackson, Jr.
Attorney, Agent, or Firm—Fitzpatrick, Cella, Harper & Scinto

[57] ABSTRACT

A photoelectric conversion device has a photoelectric conversion element and a light-receiving window formed on an insulating substrate. An opening of the window is defined by a combination of plurality of opaque layers formed on the insulating substrate.

6 Claims, 5 Drawing Sheets

PHOTOELECTRIC CONVERSION DEVICE

This application is a continuation of application Ser. No. 07/532,130 filed Jun. 5, 1990, which is a continuation of application Ser. No. 07/205,669 filed Jun. 13, 1988, both now abandoned.

BACKGROUND OF THE INVENTION

1. Field of the Invention

The present invention relates to a photoelectric conversion device and, more particularly, to the device suitable for a facsimile apparatus, an image reader, a digital copying machine, or the like, which has a linear line sensor corresponding to the widthwise direction of an original, and reads image information while the original is moved relative to the linear line sensor.

2. Related Background Art

A known conventional photoelectric conversion device has an elongated linear line sensor (equal magnification type line sensor) has the same length as an original document width. The sensor is brought into direct contact with the original document. The sensor further does not require a focusing system or can reduce an operating distance of the focusing system. Such a conversion device can be utilized in a compact and low-cost machine.

In a known photoelectric conversion device having an equal magnification type line sensor which can reduce an operating distance of a focusing system, a convergence optical fiber or a contact lens array is used in the focusing system. In another known photoelectric conversion device having an equal magnification type line sensor which requires no focusing system, a line sensor is arranged on a transparent substrate, and light is irradiated onto an original surface from the rear surface side of the substrate. Light reflected by the original surface is then received on the line sensor.

An arrangement, wherein light incident from the rear surface side of the substrate is reflected and scattered by the original surface can be applied to a photoelectric conversion device with or without a focusing system. In particular, when the focusing system is omitted, since the original surface is brought perfectly into tight contact with the surface of the photoelectric conversion device, an advantage is that such an arrangement would be made more compact. In this arrangement, construction of light incident from the rear surface of the substrate is considered to be most preferable.

FIG. 1 shows a proximity conversion device which does not require a focusing system. FIG. 2 is a cross-sectional view taken along line A—A' in FIG. 1. An opening of a light-receiving window for a photoelectric conversion device S is indicated by W. The opening W of the window is defined by a closed hole formed in a first opaque layer formed on a glass substrate. However, in this related art, when the light-receiving window is formed, the following problems are posed.

(1) When the opaque layer is patterned in a hole shape by etching, an unetched portion is often formed in a hole forming portion of the hole-shaped closed pattern. Consequently, a hole having suitable shape and required size is rarely formed. Accordingly, as the area of the hole-shaped closed pattern is decreased, an unetched portion is formed more easily, which results in the original not being adequately illuminated. For example, in a proximity type linear-image sensor, when an A4-sized original is read at a density of 8 dots/mm, eight windows per mm are required. If the reading density is 16 dots/mm, sixteen windows twice the above case, are required. As the reading density is increased, it would be necessary that each window that is the area of the opening is reduced. As a result, etching errors occur more frequently, thus decreasing a yield.

(2) When the opaque layer formed on a large-area substrate is to be etched to form hole-shaped closed patterns, etching nonuniformity easily occurs. As the area of the substrate of the photoelectric conversion device is increased, an improvement of the yield cannot be expected.

In order to eliminate the unetched portion and etching nonuniformity, an etching method, that is a process that an etching solution mist is blown onto the substrate would be used. However, with this method, it is also difficult to etch all the windows uniformly. In mass-production, a special apparatus and special steps are required, resulting in poor mass-producibility and high cost.

SUMMARY OF THE INVENTION

It is an object of the present invention to provide a photoelectric conversion device having photoelectric conversion elements and light-receiving windows formed on an insulating substrate, wherein an opening of each window is defined by a plurality of opaque layers formed on the insulating substrate, and each opaque layer does not have a hole-shaped closed shape. Thus, the problems of the related art can be solved without requiring a special etching means and causing an etching error even if a conventional etching means is used.

DESCRIPTION OF THE PREFERRED EMBODIMENTS

EXAMPLE 1

The present invention will be described with reference to the accompanying drawings.

Figure 1:
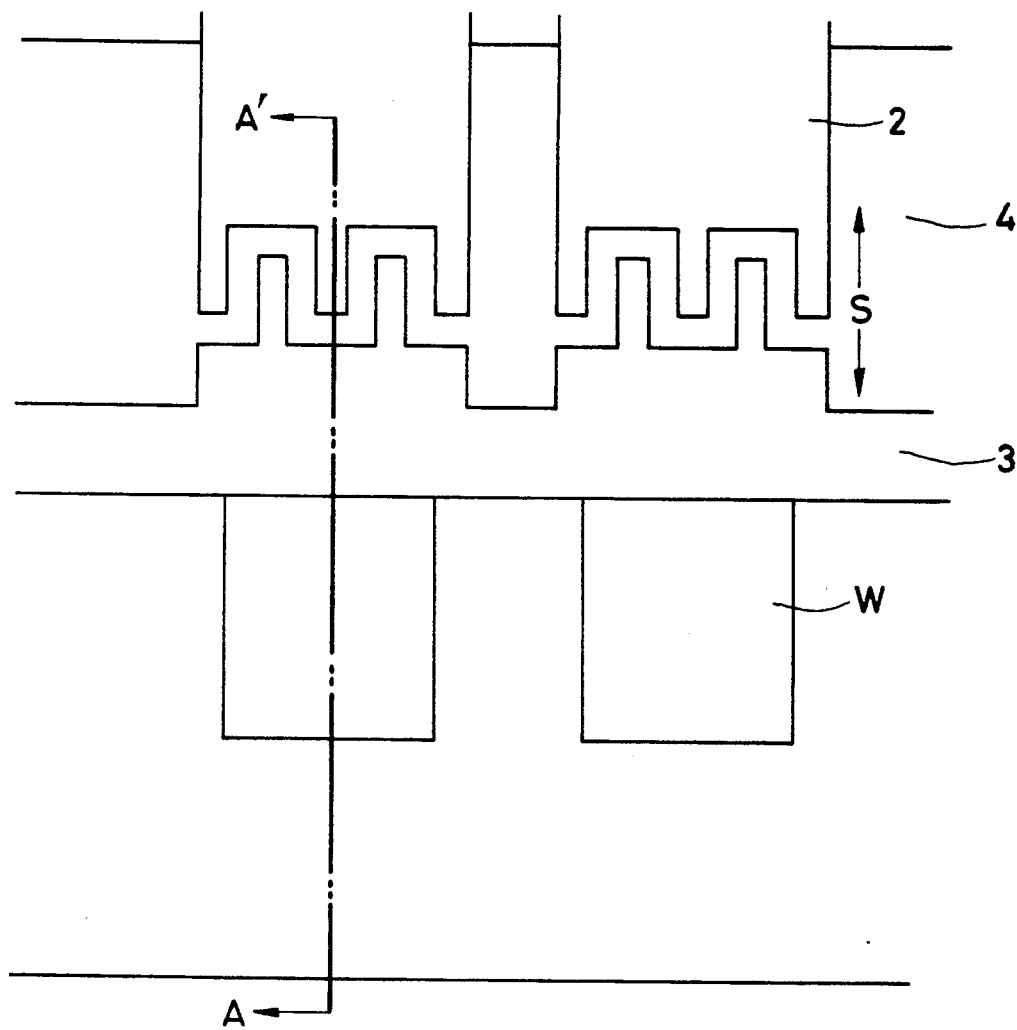
FIG. 1 is a view showing a related art structure.
Figure 2:
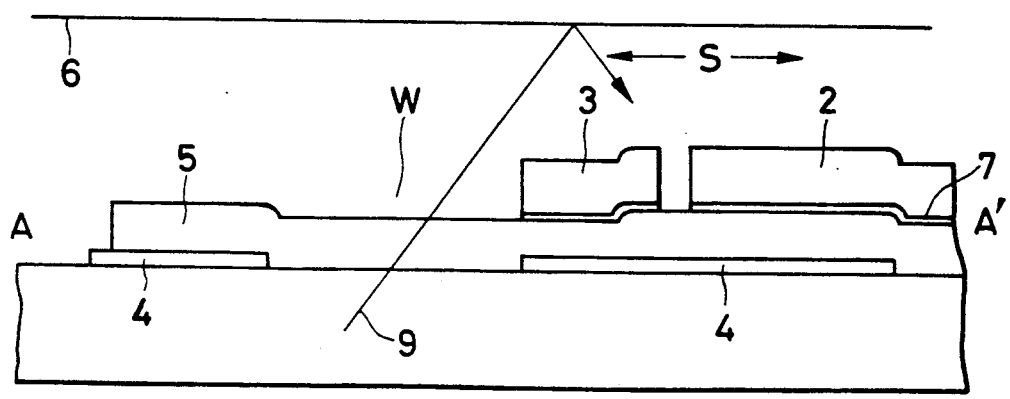
FIG. 2 is a cross-sectional view taken along a line A—A' in FIG. 1.
Figure 3:
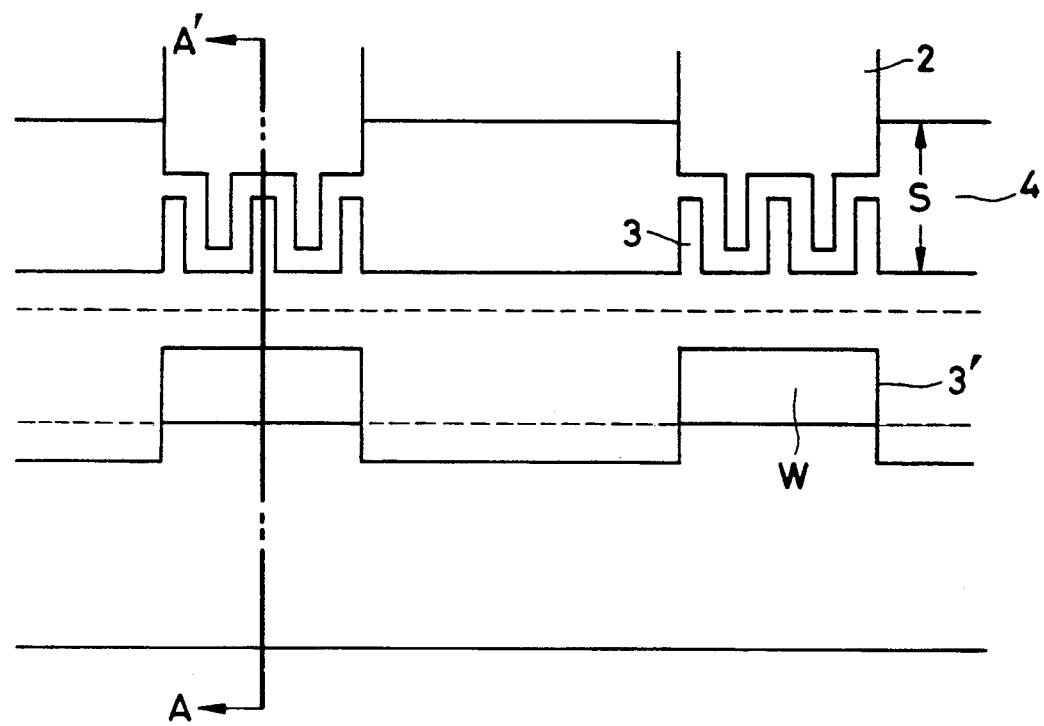
FIG. 3 is a view showing a first embodiment of the present invention.
Figure 4:
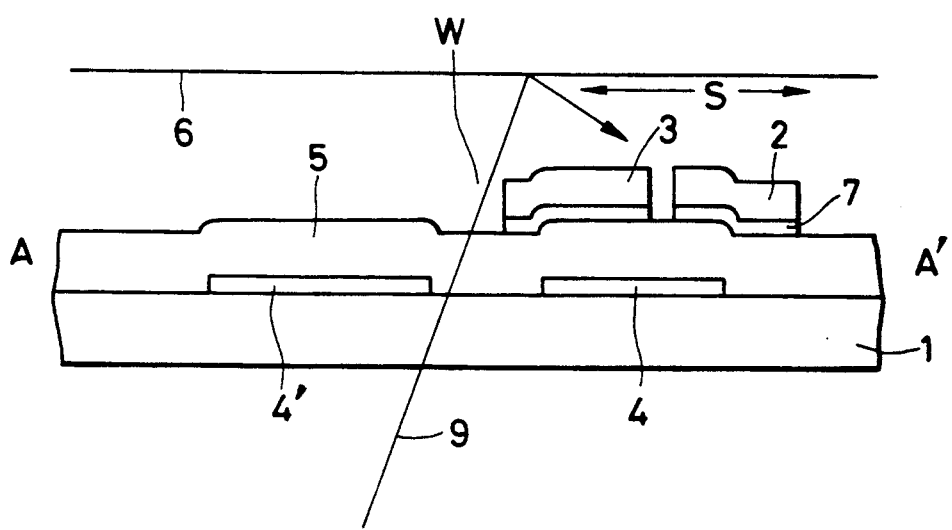
FIG. 4 is a cross-sectional view taken along a line A—A' in FIG. 3.

FIG. 3 best illustrates the characteristic feature of the present invention, showing a two-bit portion of a photoelectric conversion device in which photoelectric conversion elements and light-receiving windows are formed on a single substrate in a linear array. FIG. 4 is a cross-sectional view taken along a line A—A' in FIG. 3.

A 1,000-Å thick Cr film serving as a first opaque layer is deposited on a washed glass substrate 1 by deposition. Instead of the deposition, sputtering can be used. A photoresist was coated on the Cr film to form a pattern (in this case, a stripe pattern common to all photoelectric conversion elements) defining an opening W of a window paired with a second opaque layer to be formed later. The Cr film is etched by an $(NH_4)_2Ce(NO_3)/HClO_4$ aqueous solution using the photoresist pattern as a mask. As a result, first stripe opaque layers 4 and 4' are formed. Neither an unetched portion nor etching nonuniformity is found. After the photoresist is removed, a 1-μm thick amorphous silicon (A-Si:H) layer 5 serving as a photoconductive layer is deposited using a gas mixture of $SiH_4$ and $H_2$ by an RF glow discharge method. Subsequently, a 1,500-Å thick n+ type A-Si:H layer 7 doped with P as an impurity was deposited using a gas mixture of $SiH_4$, $H_2$, and $PH_3$.

A 1-μm, thick Al film serving as a second opaque layer is deposited on the resultant structure. Instead of the deposition, sputtering can be used. A photoresist was coated on the Al film to form an open pattern which defines the opening W paired with the first stripe opaque layer. Since the second opaque layer is also used as individual and common electrodes of the photoelectric conversion element, the electrode pattern is also formed at the same time. Thereafter, the Al film is etched by an $H_3PO_4/HNO_3/CH_3COOH$ aqueous solution using the photoresist pattern as a mask, thereby forming a portion 3' which defines the opening W paired with an individual electrode 2, a common electrode 3, and the first stripe opaque layer 4, 4'. In this case, an etching error due to an unetched portion or etching nonuniformity does not occur. As can be seen from FIGS. 3 and 4, a rectangular window portion W, for light receiving defined by the first and second opaque layers 4, 4', and 3 do not overlap each other. After the photoresist is removed, an unnecessary portion of the n+-doped layer is removed using the Al pattern as a mask by dry etching using a $CF_4$ gas.

In this embodiment, a linear line sensor corresponding to an A4 size is manufactured using a large-area substrate. However, even if the area of the substrate is increased, an improper opening due to etching nonuniformity is not observed at all.

EXAMPLE 2

Figure 5:
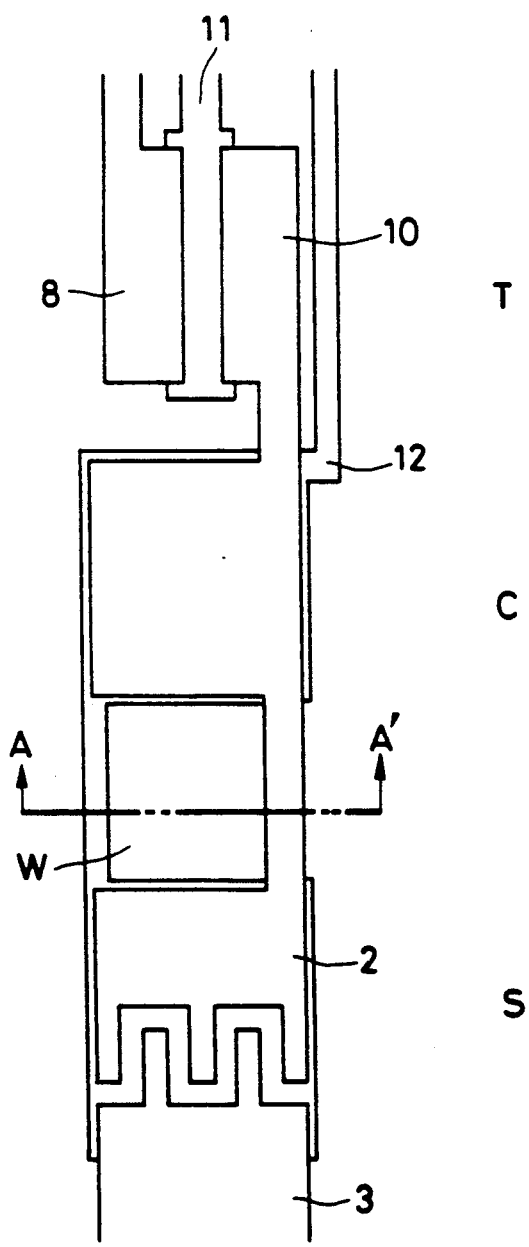
FIG. 5 is a view showing a second embodiment of the present invention.
Figure 6:
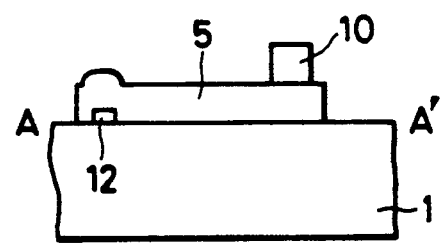
FIG. 6 is a cross-sectional view taken along a line A—A' in FIG. 5.

Another embodiment will be described below wherein a photoelectric conversion element, an accumulation capacitor, a thin film transistor (to be referred to as a TFT hereinafter), a wiring matrix, and a light-receiving window are formed integrally on a single substrate. FIG. 5 shows such a photoelectric conversion device corresponding to one bit. FIG. 6 is a cross-sectional view taken along a line A—A' in FIG. 5.

A 1,000-Å thick Cr film serving as a first opaque layer was deposited on a washed glass substrate 1 by deposition. Instead of the deposition, sputtering can be used. A photoresist was coated on the Cr film to form an open pattern (in this case, a portion of W has a U shape) for defining an opening W paired with a second opaque layer described below. In this case, since the first opaque layer was also used as the gate electrode 11 of the TFT and the lower electrode 3 of the accumulation capacitor, the patterns of the gate electrode and the lower electrode of the accumulation capacitor were also formed at the same time. Subsequently, the Cr film is etched by an $(NH_4)_2Ce(NO_3)_6/HClO_4$ aqueous solution using the photoresist pattern as a mask, thereby patterning the Cr film. In this case, no etching errors, such as an unetched portion, etching nonuniformity, and the like, are found. After the photoresist was removed, a silicon nitride film is deposited by RF glow discharging using a gas mixture of $SiH_4$, $H_2$, and $N_2$. Subsequently, an A-Si:H film 5 was deposited using a gas mixture of $SiH_4$ and $H_2$. Furthermore, an N+-doped A-Si:H layer was deposited using a gas mixture of $SiH_4$, $H_2$ and $PH_3$. A photoresist was then coated on the resultant structure to form a contact hole pattern. These three deposition layers were etched by dry etching using a $CF_4$ gas and the photoresist pattern as a mask, thereby forming contact holes. Thereafter, an Al film serving as a second opaque layer was formed by deposition or the like. A photoresist is coated on the Al film so as to form second opaque layer 10 of an open pattern (in this case, a U-shaped pattern) for defining the opening W paired with the first opaque layer. In this case, since the second opaque layer was also used as an electrode 2, 3 of the photoelectric conversion element, the upper electrode 2 of the accumulation capacitor, the source and drain electrodes 8 of the TFT, patterns of these electrodes are also formed at the same time. The Al film was then etched by an $H_3PO_4/HNO_3/CH_3COOH$ aqueous solution using the photoresist pattern as a mask. In this case, no etching error due to an unetched portion, etching nonuniformity, or the like is found.

After the photoresist is removed, an unnecessary portion of the n+-doped A-Si:H layer is removed by dry etching using a $CF_4$ gas and the Al pattern as a mask. Finally, a photoresist was coated on the resultant structure, and unnecessary portions of the A-Si:H and silicon nitride layers are removed by dry etching using a $CF_4$ gas and the photoresist pattern as a mask, thereby achieving element isolation.

In this embodiment, a linear line sensor corresponding to an A4 size was also manufactured using a large-area substrate in the same manner as in the first embodiment. However, no etching errors due to etching nonuniformity, caused by an increase in area of the substrate, were found at all.

EXAMPLE 3

Figure 7:
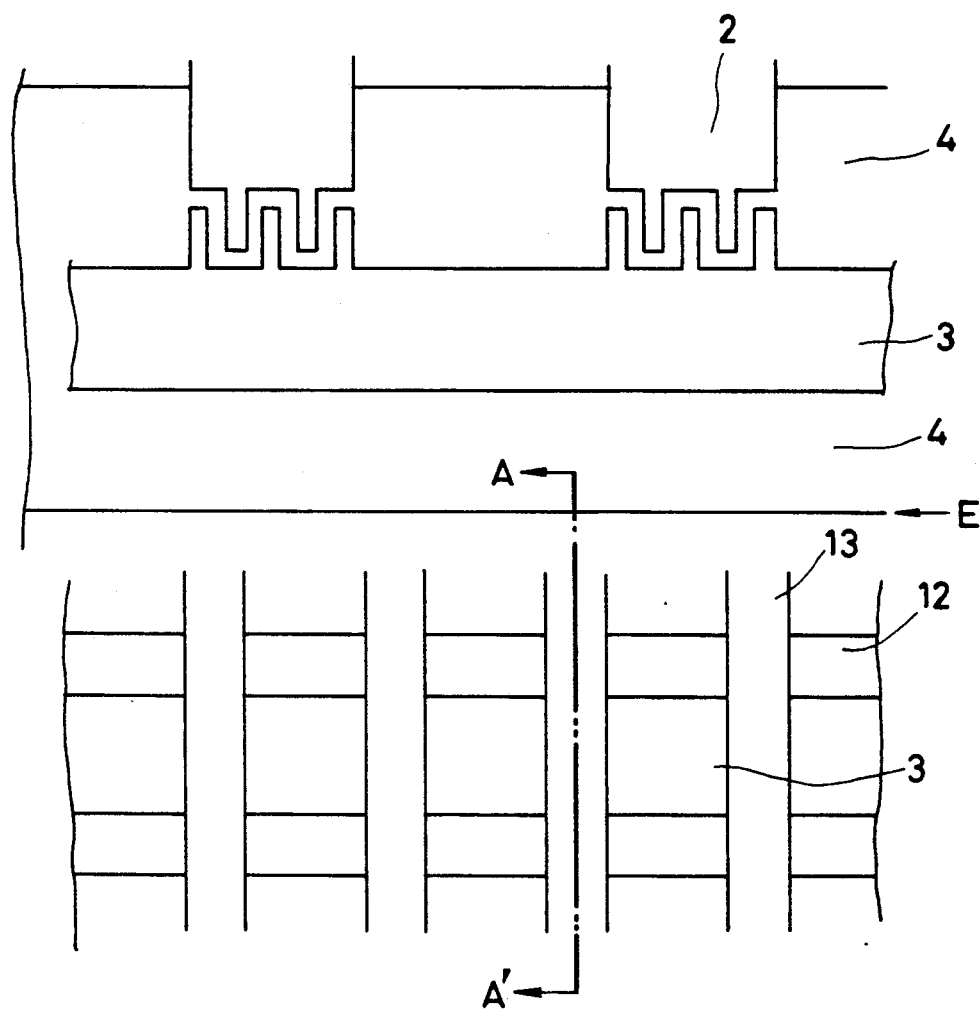
FIG. 7 is a view showing a third embodiment of the present invention.
Figure 8:
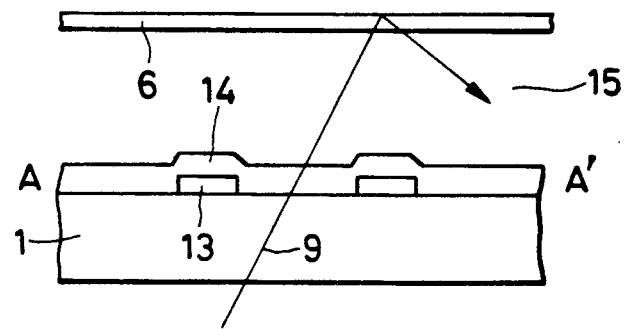
FIG. 8 is a cross-sectional view taken along a line A—A' in FIG. 7.

Still another embodiment will be described hereinafter wherein a photoelectric conversion element portion and a light-receiving window are formed on separate substrates. FIGS. 7 and 8 show the structure of this embodiment. FIG. 8 is a cross-sectional view of only a light-receiving window taken along a line A—A' in FIG. 7. A description will be made with reference to FIGS. 7 and 8. A Cr film serving as a first opaque layer 13 is deposited on a washed glass substrate 1 by deposition or the like. A photoresist was coated on the Cr film so as to form an open pattern (in this case, a stripe pattern) for defining an opening W paired with a second opaque layer described below. The Cr film was etched by an $(NH_3)_2Ce(NO_3)_6/HClO_4$ aqueous solution using the photoresist pattern as a mask. After the photoresist was removed, an Al film serving as a second opaque layer 14 was deposited on the resultant structure by deposition, sputtering, or the like. A photoresist was coated on the Al film so as to form an open pattern (in this case, a stripe pattern perpendicular to the stripe pattern of the first opaque layer 13) for defining the opening W paired with the first opaque layer 13. The Al film was then etched by an $H_3PO_4/HNO_3/CH_3COOH$ aqueous solution. In this embodiment, a line sensor corresponding to an A4 size was manufactured using a large-area substrate. However, no etching error such as etching nonuniformity caused by an increase in area of the substrate were found at all. Finally, an SiO$_2$ film or the like serving as a protection film 15 was deposited by sputtering or the like. Since the opening was formed on a separate substrate, it can be utilized as an original light-receiving window, and can also be utilized as a shading member for correcting an amount of light from an original illumination light source. A sensitivity distribution in an array direction of the photoelectric conversion elements, and a light amount distribution in the array direction of the light source, and the like were calculated in advance. Accordingly the opening is designed for a proper an amount of light.

Figure 9:
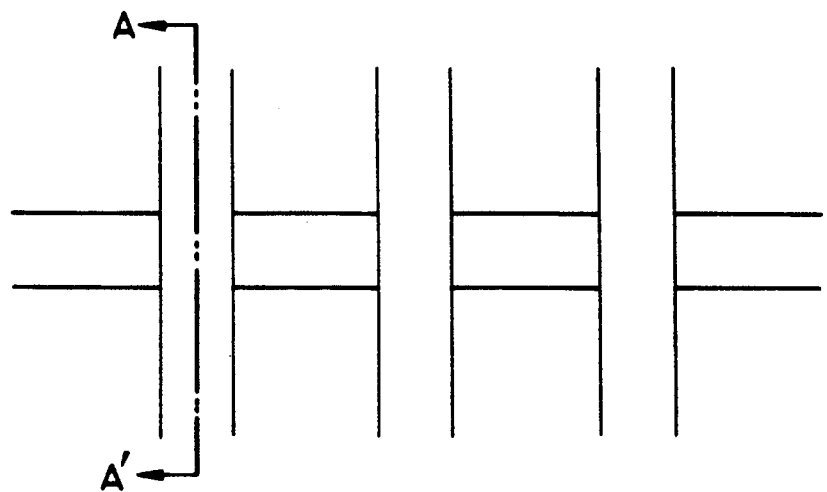
FIG. 9 is a view showing a fourth embodiment of the present invention.
Figure 10:
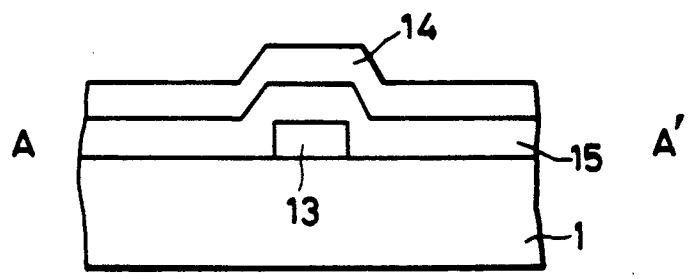
FIG. 10 is a cross-sectional view taken along a line A—A' in FIG. 9.

The pattern shape of the opaque layer was not limited to a stripe pattern of this embodiment unless it is a closed hole shape. In this embodiment, the Cr film serving as the first opaque layer 13 and the Al film serving as the second opaque layer 14 are used. However, as shown in FIGS. 9 and 10, Al films may be formed for both the first and second opaque layers through light-transmission layers.

In this embodiment, a window is defined by the two opaque layers. However, if two or more opaque layers are used, the same operation and effect as described above can be obtained.

When openings of various sizes are formed, no etching errors such as an unetched portion, etching nonuniformity, and the like are found. It is found that the present invention can easily cope with an increase in area of the substrate 1 and miniaturization of a high-density read pattern of a photoelectric transducer.

According to the above embodiments, the following effects can be obtained.

(1) An unetched portion of an opening of a window in a photoelectric conversion device can be eliminated without using a special etching method, and etching can be uniformly performed over a wide range. If a large-area substrate is used, no problem occurs, thus reducing manufacturing cost and improving a yield. As a result, mass-producibility can be improved.

(2) A plurality of stacked opaque layers define an opening of a window. Since each film can be etched satisfactorily, a window area can be accurately defined, and a micropattern can be easily formed. Thus, miniaturization of a window pattern upon an increase in read density of a photoelectric conversion device can be easily coped with. Since only light of a quantity necessary to each photoelectric conversion element can be derived from corresponding illumination window, adverse effect to another photoelectric conversion elements would be very little.

(3) The area of a window can be arbitrarily changed by changing a size of at least one of opaque films defining an area of a window. Thus, an amount of light can be easily corrected.

We claim:

1. A photoelectric conversion device comprising:
    a substrate;
    a plurality of opaque layers arranged in a laminate formed on said substrate;
    a photoelectric conversion element arranged on said substrate; and
    a light-receiving window formed on said substrate having a substantially closed opening defined by a combination of said plurality of laminated opaque layers, wherein said combination comprises first and second ones of said opaque layers laminated so as to sandwich therebetween a third layer, wherein said first and second ones of said opaque layers are at different lamination levels with respect to said substrate, and wherein neither of said first and second ones of said opaque layers alone completes said substantially closed opening and said first and second ones of said opaque layers in combination complete said substantially closed opening.

2. A device according to claim 1, further comprising an electrode formed on one of said plurality of laminated opaque layers, wherein the opening is further defined by a combination of said one opaque layer, and said electrode.

3. A device according to claim 1, wherein at least one of said opaque layers comprise Cr.

4. A device according to claim 2, wherein
    said electrode comprises Al.

5. A device according to claim 1, wherein
    said photoelectric conversion element has a photoelectric conversion layer comprising amorphous silicon.

6. A photoelectric conversion device comprising:
    a substrate;
    a plurality of photoelectric conversion elements arranged on said substrate;
    a first opaque layer formed on said substrate;
    a light transmitting layer formed on said first opaque layer; and
    a second opaque layer formed on said light transmitting layer at a different lamination level than first opaque layer with respect to said substrate, wherein said light transmitting layer is sandwiched between said first and second opaque layers, and wherein an optical path is defined by a substantially closed pattern for introducing light through said light transmitting layer and said opaque layers, and wherein neither of said first and second opaque layers alone complete said substantially closed pattern and wherein said first and second opaque layers in combination complete said substantially closed pattern.

* * * * *

UNITED STATES PATENT AND TRADEMARK OFFICE
CERTIFICATE OF CORRECTION

PATENT NO. : 5,159,422

DATED : October 27, 1992

INVENTOR(S) : KAZUAKI TASHIRO, ET AL.

It is certified that error appears in the above-identified patent and that said Letters Patent is hereby corrected as shown below:

Title page:

IN [56] REFERENCES CITED

Under FOREIGN PATENT DOCUMENTS, "5697524  1/1983 Japan" should read --56-97524  1/1983  Japan--.

COLUMN 1

Line 20, "has" should read --having--.
Line 39, "arrangement," should read --arrangement--.

COLUMN 2

Line 2, "twice the above case," should be deleted.
Line 17, "uniformily." should read --uniformly.--.

COLUMN 3

Line 12, "etching" should read --an etching--.
Line 19, "1-µm," should read --1-µm--.

COLUMN 5

Line 2, "error" should read --errors--.
Line 14, "Accordingly" should read --Accordingly,--.
Line 15, "an" should be deleted.

UNITED STATES PATENT AND TRADEMARK OFFICE
CERTIFICATE OF CORRECTION

PATENT NO. : 5,159,422
DATED : October 27, 1992
INVENTOR(S) : KAZUAKI TASHIRO, ET AL.

It is certified that error appears in the above-identified patent and that said Letters Patent is hereby corrected as shown below:

<u>COLUMN 6</u>

Line 44, "than first" should read --than said first--.
   Line 52, "comlete" hsould read --completes--.

Signed and Sealed this

Thirtieth Day of November, 1993

Attest:

BRUCE LEHMAN

Attesting Officer     Commissioner of Patents and Trademarks